US012756373B2

(12) United States Patent
Nakatsutsumi

(10) Patent No.: US 12,756,373 B2
(45) Date of Patent: Oct. 6, 2026

(54) MULTILAYER ELECTRONIC COMPONENT

(71) Applicant: TDK Corporation, Tokyo (JP)

(72) Inventor: Jun Nakatsutsumi, Tokyo (JP)

(73) Assignee: TDK CORPORATION, Tokyo (JP)

( * ) Notice: Subject to any disclaimer, the term of this patent is extended or adjusted under 35 U.S.C. 154(b) by 139 days.

(21) Appl. No.: 18/792,613

(22) Filed: Aug. 2, 2024

(65) Prior Publication Data

US 2025/0055436 A1 Feb. 13, 2025

(30) Foreign Application Priority Data

Aug. 8, 2023 (JP) ................................ 2023-129019

(51) Int. Cl.
*H03H 7/09* (2006.01)
*H01F 27/28* (2006.01)
*H03H 7/01* (2006.01)

(52) U.S. Cl.
CPC ........... *H03H 7/09* (2013.01); *H01F 27/2847* (2013.01); *H03H 7/1741* (2013.01)

(58) Field of Classification Search
CPC ..... H03H 7/09; H03H 7/1741; H01F 27/2847
See application file for complete search history.

(56) References Cited

U.S. PATENT DOCUMENTS

2007/0103256 A1* 5/2007 Ishiwata ............... H01P 1/2039 333/185
2010/0259344 A1 10/2010 Nosaka
2015/0310994 A1* 10/2015 Yosui ..................... H03H 7/175 361/303
2017/0026024 A1* 1/2017 Kuribara .................. H03H 7/42
2023/0077950 A1 3/2023 Sato et al.

* cited by examiner

*Primary Examiner* — Samuel S Outten
(74) *Attorney, Agent, or Firm* — XSENSUS LLP

(57) ABSTRACT

An electronic component includes a stack, a first inductor, and a second inductor. The first inductor includes a first conductor layer, a first columnar conductor, and a second columnar conductor. The second inductor includes a second conductor layer, a third columnar conductor, and a fourth columnar conductor. At least part of the first conductor layer extends in a direction crossing an alignment direction of the first columnar conductor and the second columnar conductor at an angle other than an odd number multiple of 90 degrees. At least part of the second conductor layer extends in a direction crossing an alignment direction of the third columnar conductor and the fourth columnar conductor at an angle other than an odd number multiple of 90 degrees.

9 Claims, 11 Drawing Sheets

MULTILAYER ELECTRONIC COMPONENT

CROSS-REFERENCE TO RELATED APPLICATION

This application claims the benefit of Japanese Priority Patent Application No. 2023-129019 filed on Aug. 8, 2023, the entire contents of which are incorporated herein by reference.

BACKGROUND OF THE INVENTION

1. Field of the Invention

The present invention relates to a multilayer electronic component including an inductor.

2. Description of the Related Art

One of electronic components used in a communication apparatus is a band-pass filter. As the band-pass filter, an LC resonator constituted by an inductor and a capacitor is used, for example.

The recent market requires reductions in size and footprint of the compact mobile communication apparatuses, and also requires downsizing of band-pass filters used in those communication apparatuses. A band-pass filter suitable for downsizing is a known band-pass filter including a stack including a plurality of dielectric layers and a plurality of conductor layers stacked together.

An inductor used for the band-pass filter including the stack is a known inductor composed of a conductor layer and a plurality of through holes, the inductor being wound around an axis orthogonal to a stacking direction of the plurality of dielectric layers.

US 2010/0259344 A1 discloses a multilayer filter device constituted by a two-stage or three-stage LC parallel resonator. A plurality of inductors (LC parallel resonance circuits) are provided inside a stack of the multilayer filter device. Each of the plurality of inductors is composed of an inductor internal electrode and two inductor via electrodes provided inside the stack. The inductor internal electrode and two inductor via electrodes are formed in loop shapes inside the stack. The plurality of inductors are arranged inside the stack such that their respective loop surfaces face each other. The inductor internal electrode extends in a lateral direction of the stack.

The multilayer filter device disclosed in US 2010/0259344 A1 may cause a too strong coupling between the plurality of inductors when the stack is downsized. On the other hand, the multilayer filter device disclosed in US 2010/0259344 A1 may cause a too weak coupling between the plurality of inductors when the plurality of inductors are arranged such that their respective loop surfaces do not face each other. Thus, a coupling between the plurality of inductors being too strong or too weak may prevent desired characteristics from being achieved.

The above issue applies not only to a coupling between a plurality of inductors but also to a coupling between an inductor and an arbitrary conductor. The above issue applies not only to band-pass filters but also to multilayer electronic components in general that include inductors.

SUMMARY OF THE INVENTION

An object of the present invention is to provide a multilayer electronic component including an inductor, the multilayer electronic component being configured to achieve desired characteristics while suppressing occurrence of an issue caused by downsizing of the stack and arrangement of the inductor.

A multilayer electronic component of a first aspect of the present invention includes a stack including a plurality of dielectric layers stacked together, a first inductor including a first conductor layer extending along a plane crossing a stacking direction of the plurality of dielectric layers, a first columnar conductor extending in a direction parallel to the stacking direction and connected to a portion near a first end of the first conductor layer, and a second columnar conductor extending in a direction parallel to the stacking direction and connected to a portion near a second end of the first conductor layer being different from the first end, and a second inductor including a second conductor layer extending along a plane crossing the stacking direction, a third columnar conductor extending in a direction parallel to the stacking direction and connected to a portion near a first end of the second conductor layer, and a fourth columnar conductor extending in a direction parallel to the stacking direction and connected to a portion near a second end of the second conductor layer being different from the first end.

The stack includes a first surface and a second surface located at both ends of the stack in the stacking direction, and a first side surface, a second side surface, a third side surface, and a fourth side surface connecting the first surface and the second surface to each other. The first side surface and the second side surface are opposite to each other. The third side surface and the fourth side surface are opposite to each other. The first inductor is arranged at a position closer to the first side surface than the second side surface. The second inductor is arranged at a position closer to the second side surface than the first side surface. At least part of the first conductor layer extends in a direction crossing an alignment direction of the first columnar conductor and the second columnar conductor at an angle other than an odd number multiple of 90 degrees. At least part of the second conductor layer extends in a direction crossing an alignment direction of the third columnar conductor and the fourth columnar conductor at an angle other than an odd number multiple of 90 degrees.

A multilayer electronic component of a second aspect of the present invention includes a stack including a plurality of dielectric layers stacked together, and an inductor including a conductor layer extending along a plane crossing a stacking direction of the plurality of dielectric layers, a first columnar conductor extending in a direction parallel to the stacking direction and connected to a portion near a first end of the conductor layer, and a second columnar conductor extending in a direction parallel to the stacking direction and connected to a portion near a second end of the conductor layer being different from the first end. The conductor layer includes a first portion and a second portion extending in a direction crossing an alignment direction of the first columnar conductor and the second columnar conductor, extending in different directions, and having different lengths.

In the multilayer electronic component of the first aspect of the present invention, each of the at least part of the first conductor layer of the first inductor and the at least part of the second conductor layer of the second inductor extends in a predetermined direction defined in such a manner as that mentioned above. In the multilayer electronic component of the second aspect of the present invention, each of the first portion and the second portion of the conductor layer of the inductor extends in a predetermined direction defined in such a manner as that mentioned above. The multilayer electronic component of the first and second aspects of the present invention can achieve desired characteristics while suppressing occurrence of an issue caused by downsizing of the stack and arrangement of the inductor.

Other and further objects, features, and advantages of the present invention will appear more fully from the following description.

DETAILED DESCRIPTION OF THE PREFERRED EMBODIMENTS

First Embodiment

Figure 1:
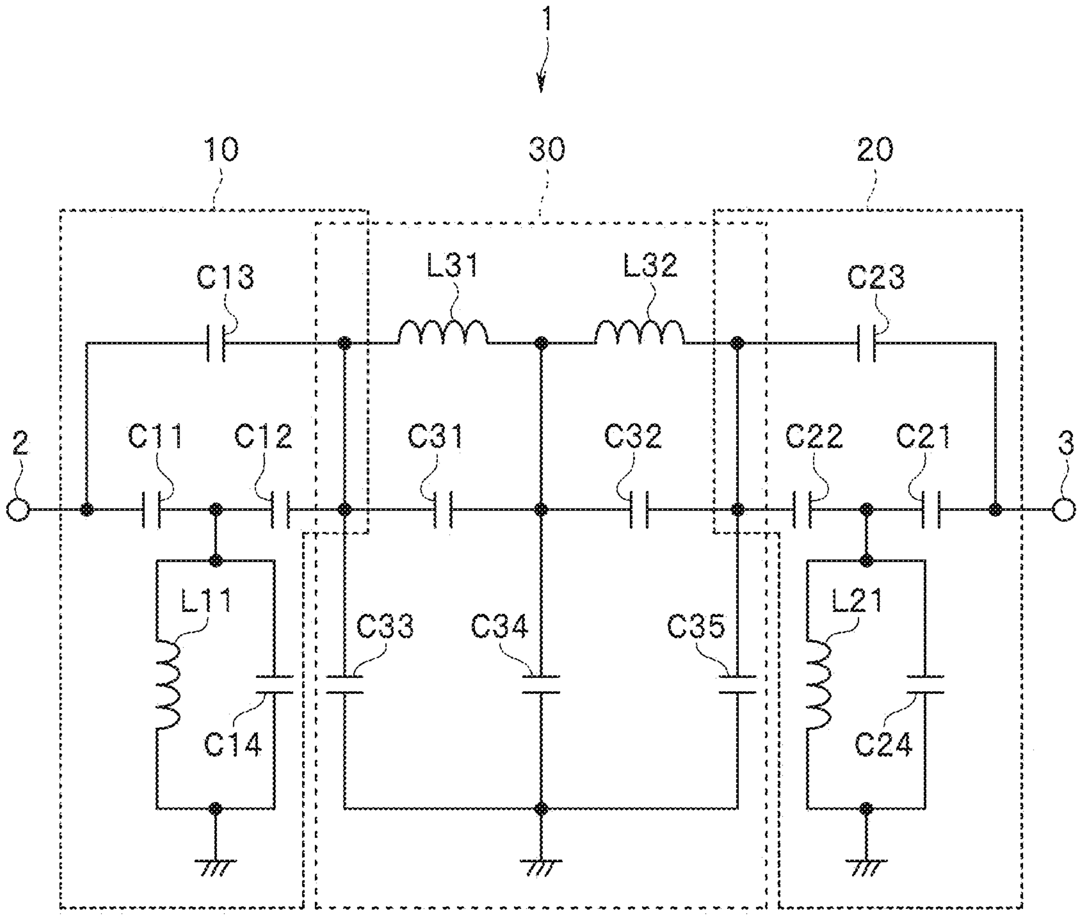
FIG. 1 is a circuit diagram showing a circuit configuration of a multilayer electronic component according to a first embodiment of the present invention.

Preferred embodiments of the present invention will now be described in detail with reference to the drawings. First, a configuration of a multilayer electronic component (hereinafter simply referred to as an electronic component) 1 according to a first embodiment of the present invention will be outlined with reference to FIG. 1. FIG. 1 is a circuit diagram showing a circuit configuration of the electronic component 1.

The electronic component 1 according to the present embodiment includes a first signal terminal 2, a second signal terminal 3, a first high-pass filter 10, a second high-pass filter 20, and a low-pass filter 30. Each of the first and second signal terminals 2 and 3 is a terminal for input or output of a signal. In other words, when a signal is input to the first signal terminal 2, a signal is output from the second signal terminal 3. When a signal is input to the second signal terminal 3, a signal is output from the first signal terminal 2.

The first high-pass filter 10, the second high-pass filter 20, and the low-pass filter 30 constitute a band-pass filter that selectively allows a signal of a frequency in a predetermined passband to pass. The first high-pass filter 10, the low-pass filter 30, and the second high-pass filter 20 are connected in series in this order, from the first signal terminal 2 towards the second signal terminal 3. The low-pass filter 30 is provided between the first high-pass filter 10 and the second high-pass filter 20, in the circuit configuration. Note that, in the present application, the expression "in the (a) circuit configuration" is used to indicate a layout in a circuit diagram, instead of a layout in a physical configuration.

Each of the first high-pass filter 10, the second high-pass filter 20, and the low-pass filter 30 is an LC filter constituted by at least one inductor and at least one capacitor. Particularly in the present embodiment, the first high-pass filter 10 includes a first inductor L11. The second high-pass filter 20 includes a second inductor L21. The low-pass filter 30 includes a third inductor L31 and a fourth inductor L32.

Next, an example of a circuit configuration of the electronic component 1 will be described with reference to FIG. 1. The first high-pass filter 10 includes a first inductor L11 and capacitors C11, C12, C13, and C14.

One end of the capacitor C11 is connected to the first signal terminal 2. One end of the capacitor C12 is connected to the other end of the capacitor C11. One end of the capacitor C13 is connected to the one end of the capacitor C11. The other end of the capacitor C13 is connected to the other end of the capacitor C12.

One end of the first inductor L11 is connected to a connection point between the capacitor C11 and the capacitor C12. The other end of the first inductor L11 is connected to a ground. The capacitor C14 is connected in parallel with the first inductor L11.

The second high-pass filter 20 includes a second inductor L21 and capacitors C21, C22, C23, and C24.

One end of the capacitor C21 is connected to the second signal terminal 3. One end of the capacitor C22 is connected to the other end of the capacitor C21. One end of the capacitor C23 is connected to the one end of the capacitor C21. The other end of the capacitor C23 is connected to the other end of the capacitor C22.

One end of the second inductor L21 is connected to a connection point between the capacitor C21 and the capacitor C22. The other end of the second inductor L21 is connected to a ground. The capacitor C24 is connected in parallel with the second inductor L21.

The low-pass filter 30 includes a third inductor L31, a fourth inductor L32, and capacitors C31, C32, C33, C34, and C35.

One end of the capacitor C31 is connected to the other end of the capacitor C12 of the first high-pass filter 10. One end of the capacitor C32 is connected to the other end of the capacitor C31. The other end of the capacitor C32 is connected to the other end of the capacitor C22 of the second high-pass filter 20.

One end of the third inductor L31 is connected to a connection point between the capacitor C12 and the capacitor C31. One end of the fourth inductor L32 is connected to the other end of the third inductor L31. The other end of the fourth inductor L32 is connected to a connection point between the capacitor C22 and the capacitor C32.

One end of the capacitor C33 is connected to a connection point between the capacitor C12 and the capacitor C31. One end of the capacitor C34 is connected to a connection point between the third inductor L31 and the fourth inductor L32 and a connection point between the capacitor C31 and the capacitor C32. One end of the capacitor C35 is connected to a connection point between the capacitor C22 and the capacitor C32. The other end of each of the capacitors C33 to C35 is connected to a ground.

Figure 2:
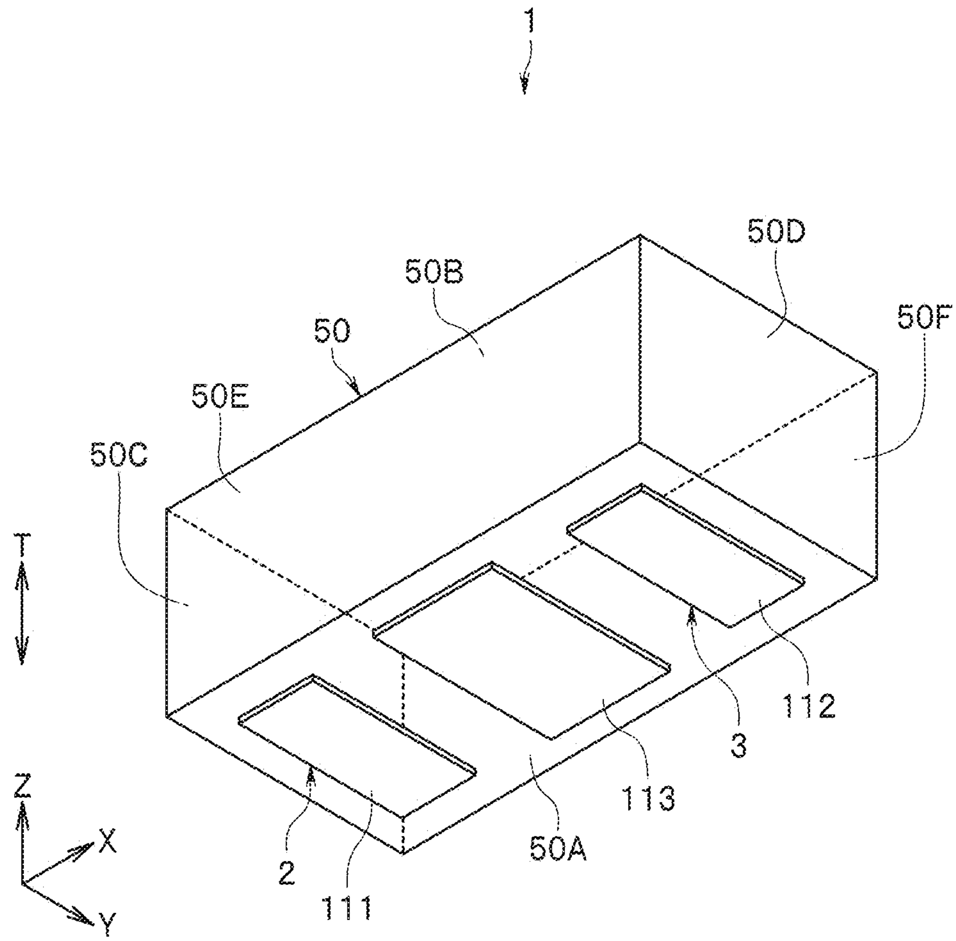
FIG. 2 is an external perspective view showing the multilayer electronic component according to the first embodiment of the present invention.

Next, other configurations of the electronic component 1 will be described with reference to FIG. 2. FIG. 2 is an external perspective view showing the electronic component 1.

The electronic component 1 further includes a stack 50 including a plurality of dielectric layers stacked together and a plurality of conductors (a plurality of conductor layers and a plurality of through holes). The first signal terminal 2, the second signal terminal 3, the first high-pass filter 10, the second high-pass filter 20, and the low-pass filter 30 are integrated with the stack 50.

The stack 50 includes a first surface 50A and a second surface 50B located at both ends in a stacking direction T of the plurality of dielectric layers, and four side surfaces 50C to 50F connecting the first surface 50A and the second surface 50B to each other. The side surfaces 50C and 50D are opposite to each other. The side surfaces 50E and 50F are opposite to each other. The side surfaces 50C to 50F may be perpendicular to the first surface 50A and the second surface 50B.

Here, X, Y, and Z directions are defined as shown in FIG. 2. The X, Y, and Z directions are orthogonal to one another. In the present embodiment, a direction parallel to the stacking direction T will be referred to as the Z direction. The opposite directions to the X, Y, and Z directions are defined as −X, −Y, and −Z directions, respectively. The expression "when viewed in the stacking direction T" means that an object is viewed from a position away in the Z direction or the −Z direction.

As shown in FIG. 2, the first surface 50A is located at the end of the stack 50 in the −Z direction. The first surface 50A is also a bottom surface of the stack 50. The second surface 50B is located at the end of the stack 50 in the Z direction. The second surface 50B is also a top surface of the stack 50. The side surface 50C is located at the end of the stack 50 in the −X direction. The side surface 50D is located at the end of the stack 50 in the X direction. The side surface 50E is located at the end of the stack 50 in the −Y direction. The side surface 50F is located at the end of the stack 50 in the Y direction.

The side surface 50C and the side surface 50D are arranged in a direction parallel to the X direction. The direction parallel to the X direction corresponds to a "second direction" in the present invention. The side surface 50E and the side surface 50F are arranged in a direction parallel to the Y direction. The direction parallel to the Y direction corresponds to a "first direction" in the present invention.

The electronic component 1 further includes a plurality of electrodes 111, 112, and 113 provided on the first surface 50A of the stack 50. The electrode 111 extends in the Y direction near the side surface 50C. The electrode 112 extends in the Y direction near the side surface 50D. The electrode 113 is arranged between the electrode 111 and the electrode 112.

The electrode 111 corresponds to the first signal terminal 2, and the electrode 112 corresponds to the second signal terminal 3. Thus, the first and second signal terminals 2 and 3 are provided on the first surface 50A of the stack 50. The electrode 113 is connected to a ground.

Next, an example of the plurality of dielectric layers and the plurality of conductors constituting the stack 50 will be described with reference to FIG. 3A to FIG. 5. In this example, the stack 50 includes seventeen dielectric layers stacked together. Hereinafter, the seventeen dielectric layers will be referred to as first to seventeenth dielectric layers in the order from bottom to top. The first to seventeenth dielectric layers are denoted by reference numerals 51 to 67, respectively.

In FIG. 3A to FIG. 4C, each circle represents a through hole. The dielectric layers 51 to 66 each have a plurality of through holes. The through holes are each formed by filling a hole intended for a through hole with a conductive paste. Each of the plurality of through holes is connected to an electrode, a conductor layer, or another through hole.

In FIG. 3A to FIG. 4C, a plurality of specific through holes of the plurality of through holes are denoted by reference numerals. A connection relation between each of the plurality of specific thorough holes and a conductor layer or another through hole is described as a connection relation in a state where the first to seventeenth dielectric layers 51 to 67 are stacked together.

Figure 3A:
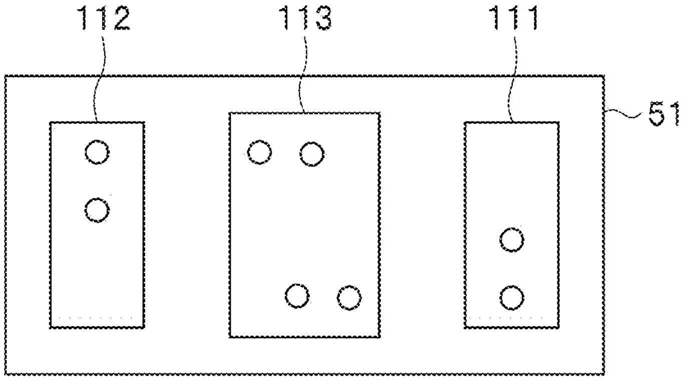
FIGS. 3A to 3C are explanatory diagrams showing respective patterned surfaces of first to third dielectric layers in a stack in the multilayer electronic component according to the first embodiment of the present invention.

FIG. 3A shows the patterned surface of the first dielectric layer 51. The electrodes 111 to 113 are formed on the patterned surface of the dielectric layer 51.

Figure 3B:
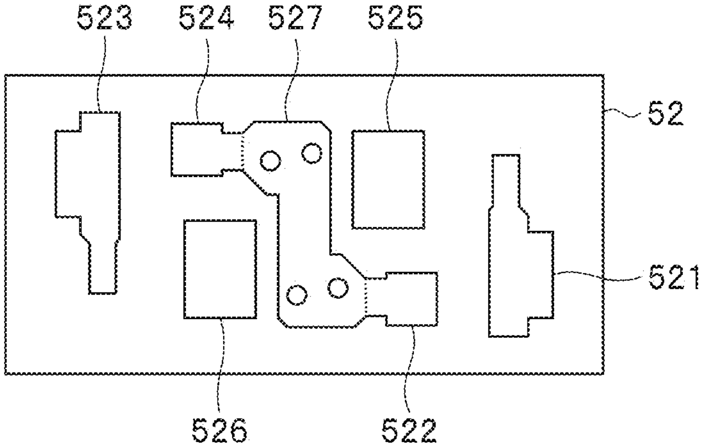

FIG. 3B shows the patterned surface of the second dielectric layer 52. A conductor layer 521, 522, 523, 524, 525, 526, 527 is formed on the patterned surface of the dielectric layer 52. The conductor layer 522, 524 is connected to the conductor layer 527. In FIG. 3B, each of the boundary between the conductor layer 522 and the conductor layer 527 and the boundary between the conductor layer 524 and the conductor layer 527 is indicated by a dotted line.

Figure 3C:
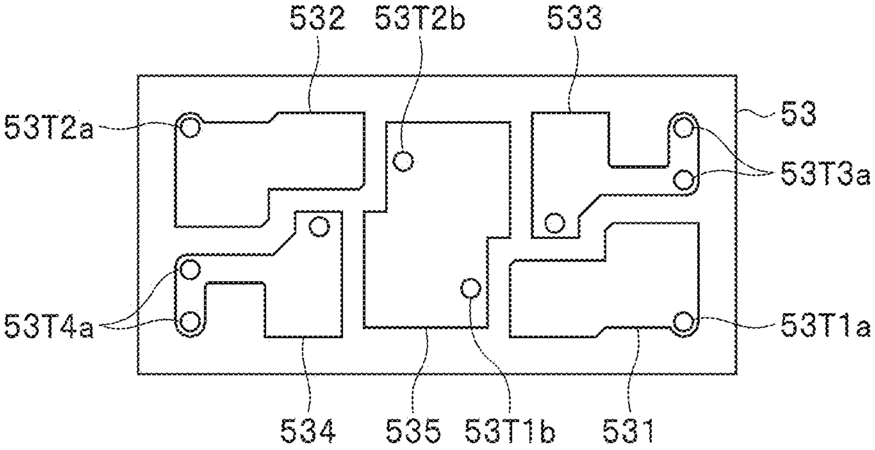

FIG. 3C shows the patterned surface of the third dielectric layer 53. A conductor layer 531, 532, 533, 534, 535 is formed on the patterned surface of the dielectric layer 53.

In FIG. 3C, a through hole denoted by a reference numeral 53T1*a* is connected to the conductor layer 531. Note that, in the following description, the through hole denoted by the reference numeral 53T1*a* is simply referred to as a through hole 53T1*a*. Such a manner for the through hole 53T1*a* similarly applies to through holes denoted by reference numerals other than the through hole 53T1*a*.

A through hole 53T2*a* shown in FIG. 3C is connected to the conductor layer 532. Through holes 53T1*b* and 53T2*b* shown in FIG. 3C are connected to the conductor layer 535. Two through holes 53T3*a* shown in FIG. 3C are connected to the conductor layer 533. Two through holes 53T4*a* shown in FIG. 3C are connected to the conductor layer 534.

Figure 4A:
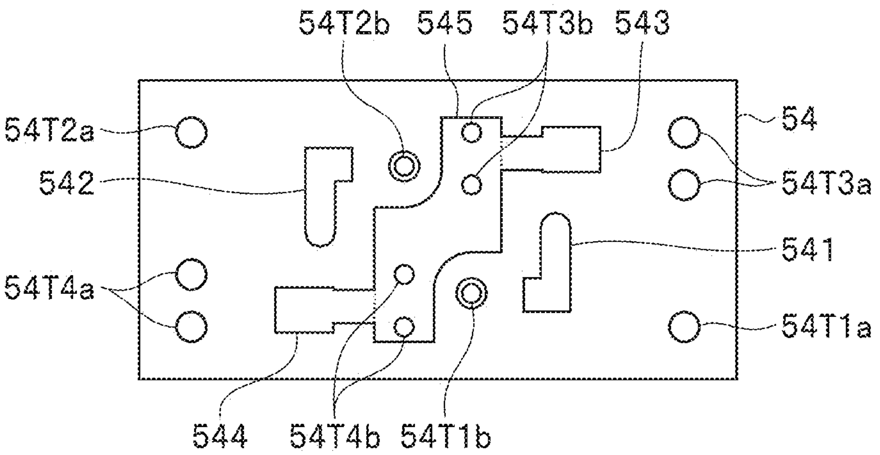
FIG. 4A is an explanatory diagram showing a patterned surface of a fourth dielectric layer in the stack in the multilayer electronic component according to the first embodiment of the present invention.

FIG. 4A shows a patterned surface of the fourth dielectric layer 54. A conductor layer 541, 542, 543, 544, 545 is formed on the patterned surface of the dielectric layer 54. The conductor layer 543, 544 is connected to the conductor layer 545. In FIG. 4A, each of the boundary between the conductor layer 543 and the conductor layer 545 and the boundary between the conductor layer 544 and the conductor layer 545 is indicated by a dotted line.

The through holes 53T1*a*, 53T1*b*, 53T2*a*, and 53T2*b* are connected respectively to through holes 54T1*a*, 54T1*b*, 54T2*a*, and 54T2*b* shown in FIG. 4A. The two through holes 53T3*a* are connected to two through holes 54T3*a* shown in FIG. 4A. The two through holes 53T4*a* are connected to two through holes 54T4*a* shown in FIG. 4A. Two through holes 54T3*b* shown in FIG. 4A and two through holes 54T4*b* shown in FIG. 4A are connected to the conductor layer 545.

Figure 4B:
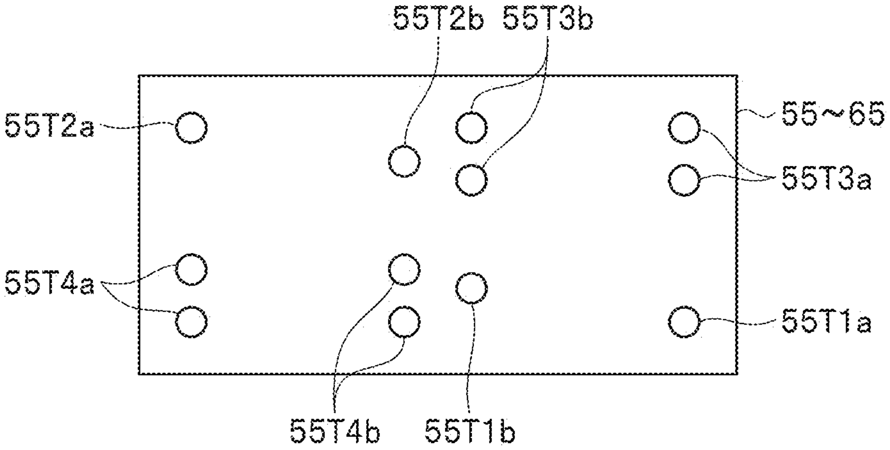
FIG. 4B is an explanatory diagram showing respective patterned surfaces of fifth to fifteenth dielectric layers in the stack in the multilayer electronic component according to the first embodiment of the present invention.

FIG. 4B shows a patterned surface of each of fifth to fifteenth dielectric layers 55 to 65. The through holes 54T1*a*, 54T1*b*, 54T2*a*, and 54T2*b* are connected respectively to through holes 55T1*a*, 55T1*b*, 55T2*a*, and 55T2*b* formed in the dielectric layer 55. The two through holes 54T3*a*, the two through holes 54T3*b*, the two through holes 54T4*a*, and the two through holes 54T4*b* are connected respectively to two through holes 55T3*a*, two through holes 55T3*b*, two through holes 55T4*a*, and two through holes 55T4*b* formed in the dielectric layer 55. In the dielectric layers 55 to 65, vertically adjacent through holes with the same reference numerals are connected to each other.

Figure 4C:
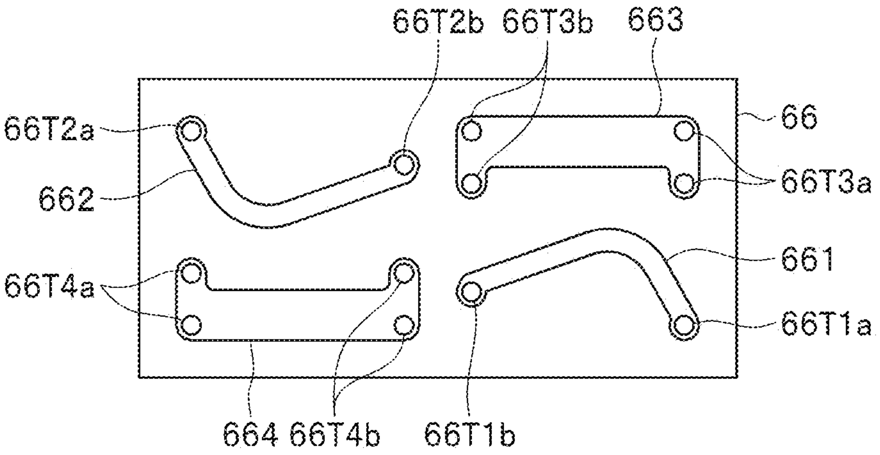
FIG. 4C is an explanatory diagram showing a patterned surface of a sixteenth dielectric layer in the stack in the multilayer electronic component according to the first embodiment of the present invention.

FIG. 4C shows a patterned surface of the sixteenth dielectric layer 66. Inductor conductor layers 661, 662, 663, and 664 are formed on the patterned surface of the dielectric layer 66. The conductor layer 661 includes a first end and a second end located at both ends of the conductor layer 661 in the longitudinal direction. The conductor layer 662 includes a first end and a second end located at both ends of the conductor layer 662 in the longitudinal direction. The conductor layer 663 includes a first end and a second end located at both ends of the conductor layer 663 in the longitudinal direction. The conductor layer 664 includes a first end and a second end located at both ends of the conductor layer 661 in the longitudinal direction.

The through hole 55T1*a* formed in the dielectric layer 65 and the through hole 66T1*a* shown in FIG. 4C are connected to a portion near the first end of the conductor layer 661. The through hole 55T1*b* formed in the dielectric layer 65 and the through hole 66T1*b* shown in FIG. 4C are connected to a portion near the second end of the conductor layer 661. The through hole 55T2*a* formed in the dielectric layer 65 and the through hole 66T2*a* shown in FIG. 4C are connected to a portion near the first end of the conductor layer 662. The through hole 55T2*b* formed in the dielectric layer 65 and the through hole 66T2*b* shown in FIG. 4C are connected to a portion near the second end of the conductor layer 662.

The two through holes 55T3*a* formed in the dielectric layer 65 and the two through holes 66T3*a* shown in FIG. 4C are connected to a portion near the first end of the conductor layer 663. The two through holes 55T3*b* formed in the dielectric layer 65 and the two through holes 66T3*b* shown in FIG. 4C are connected to a portion near the second end of the conductor layer 663. The two through holes 55T4*a* formed in the dielectric layer 65 and the two through holes 66T4*a* shown in FIG. 4C are connected to a portion near the first end of the conductor layer 664. The two through holes 55T4*b* formed in the dielectric layer 65 and the two through holes 66T4*b* shown in FIG. 4C are connected to a portion near the second end of the conductor layer 664.

Figure 5:
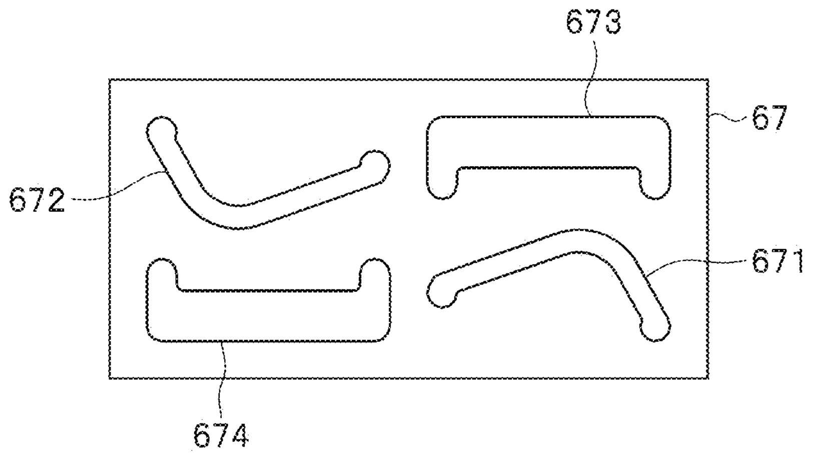
FIG. 5 is an explanatory diagram showing a patterned surface of a seventeenth dielectric layer in the stack in the multilayer electronic component according to the first embodiment of the present invention.

FIG. 5 shows a patterned surface of the seventeenth dielectric layer 67. Inductor conductor layers 671, 672, 673, and 674 are formed on the patterned surface of the dielectric layer 67. The conductor layer 671 includes a first end and a second end located at both ends of the conductor layer 671 in the longitudinal direction. The conductor layer 672 includes a first end and a second end located at both ends of the conductor layer 672 in the longitudinal direction. The conductor layer 673 includes a first end and a second end located at both ends of the conductor layer 673 in the longitudinal direction. The conductor layer 674 includes a first end and a second end located at both ends of the conductor layer 674 in the longitudinal direction.

The through hole 66T1*a* is connected to a portion near the first end of the conductor layer 671. The through hole 66T1*b* is connected to a portion near the second end of the conductor layer 671. The through hole 66T2*a* is connected to a portion near the first end of the conductor layer 672. The through hole 66T2*b* is connected to a portion near the second end of the conductor layer 672.

The two through holes 66T3*a* are connected to a portion near the first end of the conductor layer 673. The two through holes 66T3*b* are connected to a portion near the second end of the conductor layer 673. The two through holes 66T4*a* are connected to a portion near the first end of the conductor layer 674. The two through holes 66T4*b* are connected to a portion near the second end of the conductor layer 674.

The stack 50 is formed by stacking the first to seventeenth dielectric layers 51 to 67 such that the patterned surface of the first dielectric layer 51 serves as the first surface 50A of the stack 50 and the surface of the seventeenth dielectric layer 67 opposite to the patterned surface thereof serves as the second surface 50B of the stack 50.

Each of the plurality of through holes shown in FIGS. 3A to 4C is connected to a conductor layer or another through hole overlapping each of the plurality of through holes in the stacking direction T when the first to seventeenth dielectric layers 51 to 67 are stacked together. A through hole located in an electrode or in a conductor layer, among the plurality of through holes shown in FIGS. 3A to 4C, is connected to the electrode or the conductor layer.

Figure 6:
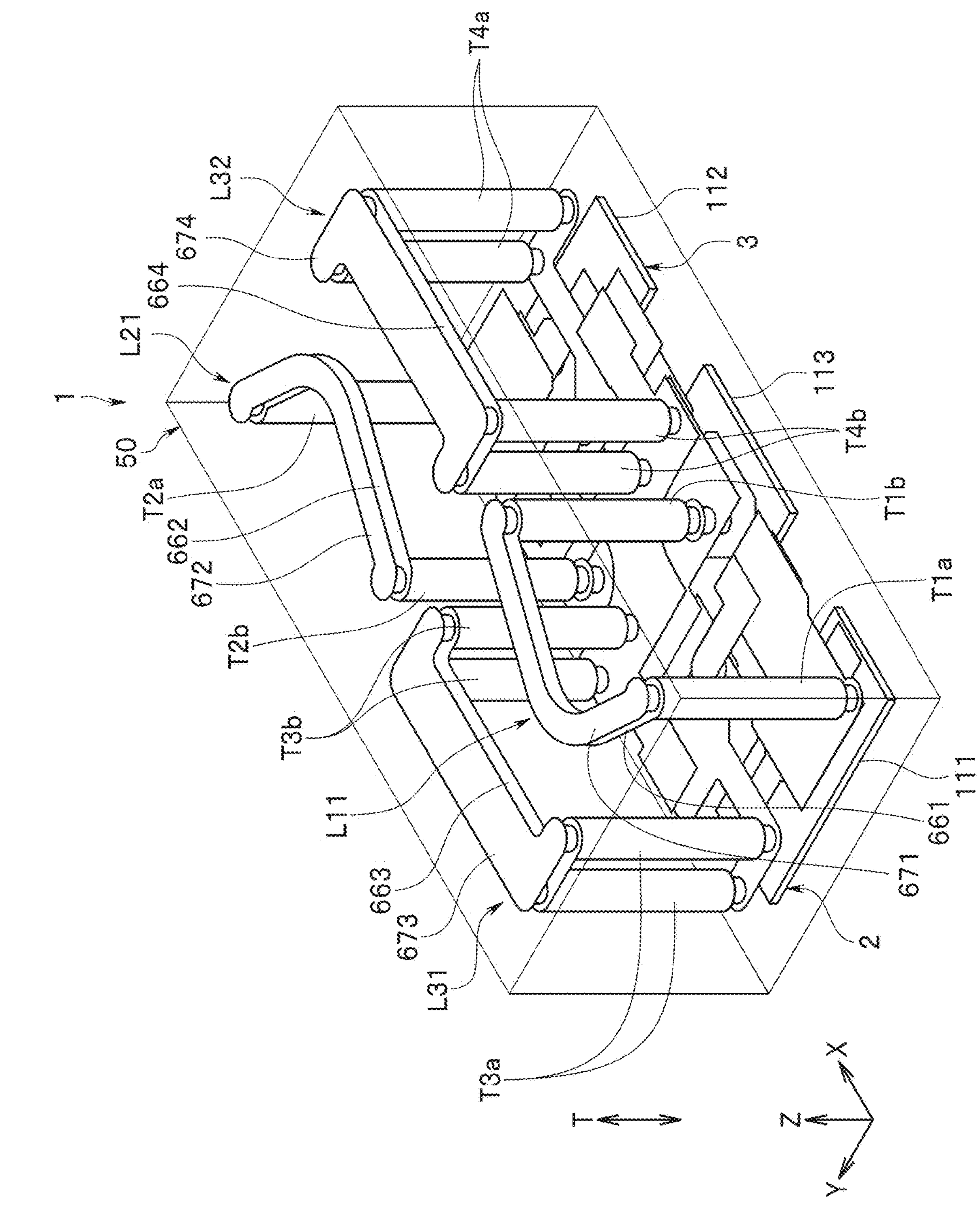
FIG. 6 is a perspective view showing an inside of the stack in the multilayer electronic component according to the first embodiment of the present invention.

FIG. 6 shows an inside of the stack 50 formed by stacking the first to seventeenth dielectric layers 51 to 67. As shown in FIG. 6, the plurality of conductor layers and the plurality of through holes shown in FIGS. 3A to 5 are stacked inside the stack 50.

Correspondences between the components of the circuit of the electronic component 1 shown in FIG. 1 and the internal components of the stack 50 shown in FIGS. 3A to 5 will now be described. First, the first high-pass filter 10 will be described. The first inductor L11 is composed of the inductor conductor layers 661 and 671 and the through holes 53T1*a*, 53T1*b*, 54T1*a*, 54T1*b*, 55T1*a*, 55T1*b*, 66T1*a*, and 66T1*b*.

The capacitor C11 is composed of the conductor layers 521 and 531 and the dielectric layer 52 interposed between these conductor layers. The capacitor C12 is composed of the conductor layers 531 and 541 and the dielectric layer 53 interposed between these conductor layers. The capacitor C13 is composed of the conductor layers 521 and 533 and the dielectric layer 52 interposed between these conductor layers. The capacitor C14 is composed of the conductor layers 522 and 531 and the dielectric layer 52 interposed between these conductor layers.

Next, components of the second high-pass filter 20 will be described. The second inductor L21 is composed of the inductor conductor layers 662 and 672 and the through holes 53T2*a*, 53T2*b*, 54T2*a*, 54T2*b*, 55T2*a*, 55T2*b*, 66T2*a*, and 66T2*b*.

The capacitor C21 is composed of the conductor layers 523 and 532 and the dielectric layer 52 interposed between these conductor layers. The capacitor C22 is composed of the conductor layers 532 and 542 and the dielectric layer 53 interposed between these conductor layers. The capacitor C23 is composed of the conductor layers 523 and 534 and the dielectric layer 52 interposed between these conductor layers. The capacitor C24 is composed of the conductor layers 524 and 532 and the dielectric layer 52 interposed between these conductor layers.

Next, components of the low-pass filter 30 will be described. The third inductor L31 is composed of the inductor conductor layers 663 and 673 and the through holes 53T3*a*, 54T3*a*, 54T3*b*, 55T3*a*, 55T3*b*, 66T3*a*, and 66T3*b*. The fourth inductor L32 is composed of the inductor conductor layers 664 and 674 and the through holes 53T4*a*, 54T4*a*, 54T4*b*, 55T4*a*, 55T4*b*, 66T4*a*, and 66T4*b*.

The capacitor C31 is composed of the conductor layers 533 and 543 and the dielectric layer 53 interposed between these conductor layers. The capacitor C32 is composed of the conductor layers 534 and 544 and the dielectric layer 53 interposed between these conductor layers.

The capacitor C33 is composed of the conductor layers 525, 533, and 535 and the dielectric layer 52 interposed between these conductor layers. The capacitor C34 is composed of the conductor layers 535 and 545 and the dielectric layer 53 interposed between these conductor layers. The capacitor C35 is composed of the conductor layers 526, 534, and 535 and the dielectric layer 52 interposed between these conductor layers.

Figure 7:
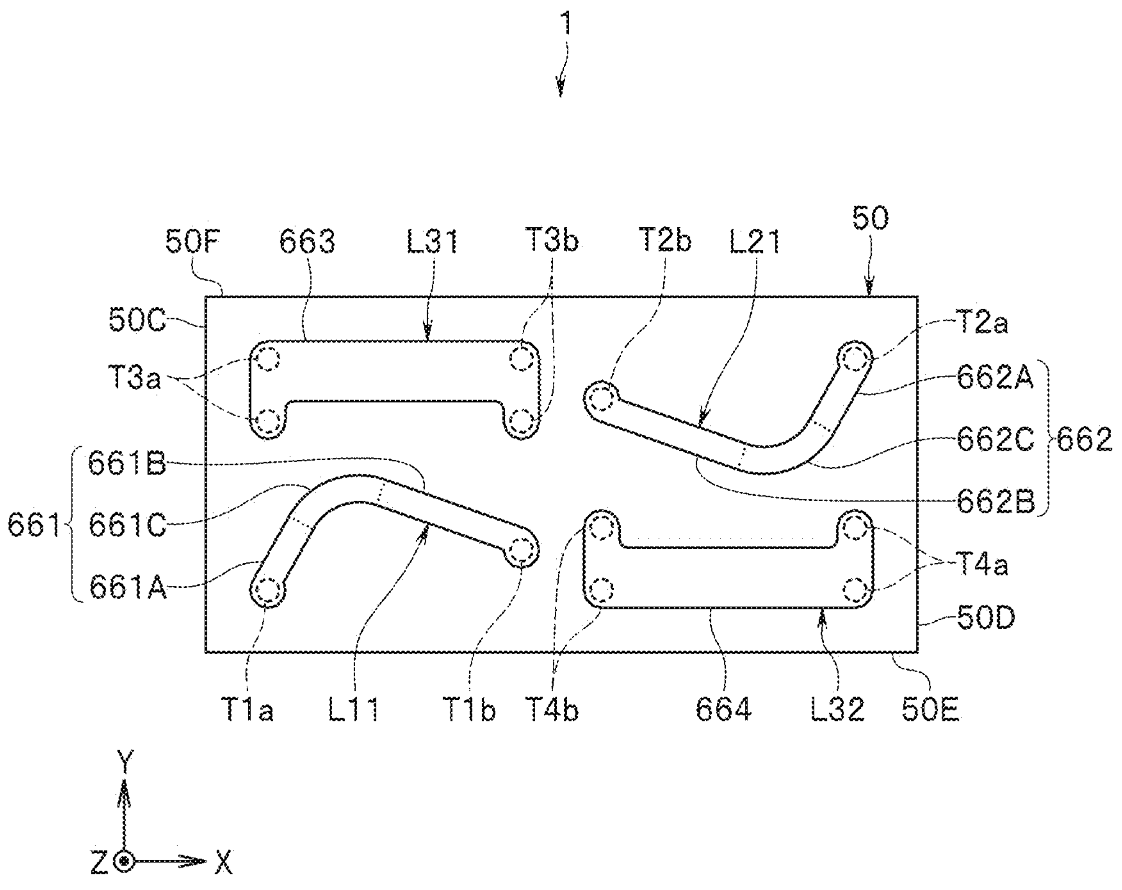
FIG. 7 is a plan view showing part of the inside of the stack in the multilayer electronic component according to the first embodiment of the present invention.

Next, structural features of the electronic component 1 according to the present embodiment will be described with reference to FIGS. 1 to 7. FIG. 7 is a plan view showing part of an inside of the stack 50. Note that FIG. 7 shows the inside of the stack 50 viewed from the second surface 50B side of the stack 50.

First, characteristics related to the first to fourth inductors L11, L21, L31, and L32 will be described. As shows in FIG. 7, the first inductor L11 of the first high-pass filter 10 is arranged at a location closer to the side surface 50C of the stack 50 than the side surface 50D of the stack 50. The first inductor L11 is arranged at a position closer to the side surface 50E of the stack 50 than the side surface 50F of the stack 50.

As shows in FIG. 7, the second inductor L21 of the second high-pass filter 20 is arranged at a position closer to the side surface 50D than the side surface 50C. The second inductor L21 is arranged at a position closer to the side surface 50F than the side surface 50E.

The first inductor L11 and the second inductor L21 are aligned along a direction from a first corner portion located at a position where the side surface 50C and the side surface 50E cross towards a second corner portion located at a position where the side surface 50D and the side surface 50F cross. As shows in FIG. 7, the third inductor L31 and the fourth inductor L32 of the low-pass filter 30 are arranged to align in a direction crossing the direction of the alignment of the first inductor L11 and the second inductor L21. Particularly in the present embodiment, the third inductor L31 is arranged between the first inductor L11 and the side surface 50F and arranged between the second inductor L21 and the side surface 50C. The fourth inductor L32 is arranged between the first inductor L11 and the side surface 50D and arranged between the second inductor L21 and the side surface 50E.

All of the first inductor L11, the second inductor L21, the third inductor L31, and the fourth inductor L32 are inductors each wound around an axis extending in a direction orthogonal to the stacking direction T. Here, a columnar structure formed by connecting a plurality of through holes in series is referred to as a columnar conductor. The columnar conductor extends in a direction parallel to the stacking direction T. Each of the first to fourth inductors L11, L21, L31, and L32 includes at least one conductor layer and a plurality of columnar conductors.

Each of the inductors L11, L21, L31, and L32 is also a rectangular shaped or approximately rectangular shaped winding. The number of winding turns of the rectangular shaped or approximately rectangular shaped winding may be, when the winding is regarded as a rectangle, counted as ¼ times per side of the rectangle. In the present embodiment, the number of winding turns of each of the inductors L11, L21, L31, and L32 is ¾ times.

The first inductor L11 includes the conductor layer 661, a first columnar conductor T1*a* connected to a portion near the first end of the conductor layer 661, and a second columnar conductor T1*b* connected to a portion near the second end of the conductor layer 661. The first columnar conductor T1*a* is formed by connecting the through holes 53T1*a*, 54T1*a*, and 55T1*a* in series. The second columnar conductor T1*b* is formed by connecting the through holes 53T1*b*, 54T1*b*, and 55T1*b* in series. The first inductor L11 is wound around a first axis orthogonal to the stacking direction T such that a first opening surrounded by the conductor layer 661, the first columnar conductor T1*a*, and the second columnar conductor T1*b* is formed.

The first inductor L11 further includes the conductor layer 671 and the through holes 66T1*a* and 66T1*b* electrically connecting the conductor layer 661 and the conductor layer 671. Note that, in FIG. 7, the conductor layer 671 and the through holes 66T1*a* and 66T1*b* of the first inductor L11 are omitted.

The second inductor L21 includes the conductor layer 662, a third columnar conductor T2*a* connected to a portion near the first end of the conductor layer 662, and a fourth columnar conductor T2*b* connected to a portion near the second end of the conductor layer 662. The third columnar conductor T2*a* is formed by connecting the through holes 53T2*a*, 54T2*a*, and 55T2*a* in series. The fourth columnar conductor T2*b* is formed by connecting the through holes 53T2*b*, 54T2*b*, and 55T2*b* in series. The second inductor L21 is wound around a second axis orthogonal to the stacking direction T such that a second opening surrounded by the conductor layer 662, the third columnar conductor T2*a*, and the fourth columnar conductor T2*b* is formed.

The second inductor L21 further includes the conductor layer 672 and the through holes 66T2*a* and 66T2*b* electrically connecting the conductor layer 662 and the conductor layer 672. Note that, in FIG. 7, the conductor layer 672 and the through holes 66T2*a* and 66T2*b* of the second inductor L21 are omitted.

The third inductor L31 includes the conductor layer 663, two columnar conductors T3*a* each connected to a portion near the first end of the conductor layer 663, and two columnar conductors T3*b* each connected to a portion near the second end of the conductor layer 663. The two columnar conductors T3*a* are formed by connecting the through holes 53T3*a*, 54T3*a*, and 55T3*a* in series. The two columnar conductors T3*b* are formed by connecting the through holes 54T3*b* and 55T3*b* in series. The third inductor L31 is wound around a third axis orthogonal to the stacking direction T such that a third opening surrounded by the conductor layer 663, the two columnar conductors T3*a*, and the two columnar conductors T3*b* is formed.

The third inductor L31 further includes the conductor layer 673 and the through holes 66T3*a* and 66T3*b* electrically connecting the conductor layer 663 and the conductor layer 673. Note that, in FIG. 7, the conductor layer 673 and the through holes 66T3*a* and 66T3*b* of the third inductor L31 are omitted.

The fourth inductor L32 includes the conductor layer 664, two columnar conductors T4*a* each connected to a portion near the first end of the conductor layer 664, and two columnar conductors T4*b* each connected to a portion near the second end of the conductor layer 664. The two columnar conductors T4*a* are formed by connecting the through holes 53T4*a*, 54T4*a*, and 55T4*a* in series. The two columnar conductors T4*b* are formed by connecting the through holes 54T4*b* and 55T4*b* in series. The fourth inductor L32 is wound around a fourth axis orthogonal to the stacking direction T such that a fourth opening surrounded by the conductor layer 664, the two columnar conductors T4*a*, and the two columnar conductors T4*b* is formed.

The fourth inductor L32 further includes the conductor layer 674 and the through holes 66T4*a* and 66T4*b* electrically connecting the conductor layer 664 and the conductor layer 674. Note that, in FIG. 7, the conductor layer 674 and the through holes 66T4*a* and 66T4*b* of the fourth inductor L32 are omitted.

The first inductor L11 and the second inductor L21 are arranged such that the first opening and the second opening do not overlap each other and the first axis and the second axis do not overlap each other when viewed in a direction parallel to the Y direction. The third inductor L31 and the fourth inductor L32 are arranged such that the third opening and the fourth opening do not overlap each other and the third axis and the fourth axis do not overlap each other when viewed in a direction parallel to the Y direction.

The first inductor L11 and the third inductor L31 are arranged such that the first opening and the third opening overlap each other when viewed in a direction parallel to the Y direction. The first inductor L11 and the third inductor L31 may be arranged such that the first axis and the third axis overlap each other or may be arranged such that the first axis and the third axis do not overlap each other, when viewed in a direction parallel to the Y direction. The first axis and the third axis may be parallel to each other, or may not be parallel to each other.

The second inductor L21 and the fourth inductor L32 are arranged such that the second opening and the fourth opening overlap each other when viewed in a direction parallel to the Y direction. The second inductor L21 and the fourth inductor L32 may be arranged such that the second axis and the fourth axis overlap each other or may be arranged such that the second axis and the fourth axis do not overlap each other, when viewed in a direction parallel to the Y direction. The second axis and the fourth axis may be parallel to each other, or may not be parallel to each other.

Next, characteristics related to the conductor layer 661 of the first inductor L11 and the conductor layer 662 of the second inductor L21 will be described with reference to FIG. 7. Each of the conductor layers 661 and 662 extends along a plane crossing the stacking direction T, in other words, the patterned surface of the dielectric layer 66.

At least part of the conductor layer 661 extends in a direction crossing an alignment direction of the first columnar conductor T1*a* and the second columnar conductor T1*b* (hereinafter referred to as a first arrangement direction) at an angle other than an odd number multiple of 90 degrees. In other words, at least part of the conductor layer 661 does not extend in the first arrangement direction and in a direction orthogonal to the first arrangement direction, and extends in a direction crossing the first arrangement direction. Note that when "at least part of the conductor layer 661" is "all of the conductor layer 661," the conductor layer 661 may include a plurality of portions extending in a direction crossing the first arrangement direction. When "at least part of the conductor layer 661" is "part of the conductor layer 661," the conductor layer 661 may further include at least one of a portion extending in the first arrangement direction and a portion extending in a direction orthogonal to the first arrangement direction.

Particularly in the present embodiment, the conductor layer 661 includes, as "at least part of the conductor layer 661," a first portion 661A including the first end of the conductor layer 661 and a second portion 661B including the second end of the conductor layer 661. The first portion 661A extends in one direction so as to approach the side surface 50F while going away from the first end of the conductor layer 661. The second portion 661B extends in one direction so as to approach the side surface 50F while going away from the second end of the conductor layer 661. The second portion 661B has a length different from that of the first portion 661A. Particularly in the present embodiment, the second portion 661B is longer than the first portion 661A.

The conductor layer 661 further includes a curved portion 661C extending in a curve. In the present embodiment, the first portion 661A is connected to one end of the curved portion 661C, and the second portion 661B is connected to the other end of the curved portion 661C. In FIG. 7, each of the boundary between the first portion 661A and the curved portion 661C and the boundary between the second portion 661B and the curved portion 661C is indicated by a dotted line.

The conductor layer 661 has an overall shape projecting in a direction from the side surface 50E towards the side surface 50F when viewed in the stacking direction T.

At least part of the conductor layer 662 extends in a direction crossing an alignment direction of the third columnar conductor T3*a* and the fourth columnar conductor T4*b* (hereinafter referred to as a second arrangement direction) at an angle other than an odd number multiple of 90 degrees. In other words, at least part of the conductor layer 662 does not extend in the second arrangement direction and in a direction orthogonal to the second arrangement direction, and extends in a direction crossing the second arrangement direction. Note that when "at least part of the conductor layer 662" is "all of the conductor layer 662," the conductor layer 662 may include a plurality of portions extending in a direction crossing the second arrangement direction. When "at least part of the conductor layer 662" is "part of the conductor layer 662," the conductor layer 662 may further include at least one of a portion extending in the second arrangement direction and a portion extending in a direction orthogonal to the second arrangement direction.

Particularly in the present embodiment, the conductor layer 662 includes, as "at least part of the conductor layer 662," a third portion 662A including the first end of the conductor layer 662 and a fourth portion 662B including the second end of the conductor layer 662. The third portion 662A extends in one direction so as to approach the side surface 50E while going away from the first end of the conductor layer 662. The fourth portion 662B extends in one direction so as to approach the side surface 50E while going away from the second end of the conductor layer 662. The fourth portion 662B has a length different from that of the third portion 662A. Particularly in the present embodiment, the fourth portion 662B is longer than the third portion 662A.

The conductor layer 662 further includes a curved portion 662C extending in a curve. In the present embodiment, the third portion 662A is connected to one end of the curved portion 662C, and the fourth portion 662B is connected to the other end of the curved portion 662C. In FIG. 7, each of the boundary between the third portion 662A and the curved portion 662C and the boundary between the fourth portion 662B and the curved portion 662C is indicated by a dotted line.

The conductor layer 662 has an overall shape projecting in a direction from the side surface 50F towards the side surface 50C when viewed in the stacking direction T.

Each of the first portion 661A of the conductor layer 661 and the third portion 662A of the conductor layer 662 substantially includes a straight portion extending in a straight line. The straight portion of the first portion 661A and the straight portion of the third portion 662A may be parallel to or approximately parallel to each other.

Each of the second portion 661B of the conductor layer 661 and the fourth portion 662B of the conductor layer 662 substantially includes a straight portion extending in a straight line. The straight portion of the second portion 661B and the straight portion of the fourth portion 662B may be parallel to or approximately parallel to each other. In an example shown in FIG. 7, the straight portion of the second portion 661B and the straight portion of the fourth portion 662B are parallel to each other.

In the present embodiment, a distance from the second portion 661B to the fourth portion 662B is shorter than a distance from the first portion 661A to the third portion 662A. Any other conductors are absent between a portion of the second portion 661B closer to the fourth portion 662B and a portion of the fourth portion 662B closer to the second portion 661B. Thus, the above portion of the second portion 661B and the above portion of the fourth portion 662B face each other. Therefore, part of the first inductor L11 and part of the second inductor L21 also face each other.

The conductor layer 661 and the conductor layer 662 have their respective overall shapes approaching each other from an outer periphery (side surfaces 50E and 50F) of the stack 50 when viewed in the stacking direction T. In each of the conductor layer 661 and the conductor layer 662, a position where a distance between the conductor layer 661 and the conductor layer 662 is minimized in a direction parallel to the Y direction is present between the first end and the second end.

A shape of the conductor layer 671 is the same as the shape of the conductor layer 661, or is a shape geometrically similar to the conductor layer 661. Arrangement of the conductor layer 671 is the same as or substantially the same as the arrangement of the conductor layer 661, except a position thereof in the stacking direction T. A shape of the conductor layer 672 is the same as the shape of the conductor layer 662, or is a shape geometrically similar to the conductor layer 662. Arrangement of the conductor layer 672 is the same as or substantially the same as the arrangement of the conductor layer 662, except a position thereof in the stacking direction T. The above description of the conductor layers 661 and 662 also applies to the conductor layers 671 and 672 if the conductor layers 661 and 662 and the columnar conductors T1*a*, T1*b*, T2*a*, and T2*b* are replaced with the conductor layers 671 and 672 and the through holes 66T1*a*, 66T1*b*, 66T2*a*, and 66T2*b*, respectively.

Next, characteristics related to the first and second columnar conductors T1*a* and T1*b* of the first inductor L11 and the third and fourth columnar conductors T2*a* and T2*b* of the second inductor L21 will be described with reference to FIG. 7. As shown in FIG. 7, the first columnar conductor T1*a* and the second columnar conductor T1*b* are arranged along the side surface 50E. The second columnar conductor T1*b* is arranged at a position farther from the side surface 50E than the first columnar conductor T1*a*. Thus, an alignment direction of the first columnar conductor T1*a* and the second columnar conductor T1*b*, in other words, the first arrangement direction, is inclined relative to the side surface 50E. The first arrangement direction is inclined relative to each of the X direction and the Y direction.

As shown in FIG. 7, the third columnar conductor T2*a* and the fourth columnar conductor T2*b* are arranged along the side surface 50F. The fourth columnar conductor T2*b* is arranged at a position farther from the side surface 50F than the third columnar conductor T2*a*. Thus, an alignment direction of the third columnar conductor T2*a* and the fourth columnar conductor T2*b*, in other words, the second arrangement direction, is inclined relative to the side surface 50F. The second arrangement direction is inclined relative to each of the X direction and the Y direction.

The second columnar conductor T1*b* and the fourth columnar conductor T2*b* are arranged between the first columnar conductor T1*a* and the third columnar conductor T2*a* in a direction parallel to the X direction. A distance between the second columnar conductor T1*b* and the fourth columnar conductor T2*b* in a direction parallel to the Y direction is smaller than a distance between the first columnar conductor T1*a* and the third columnar conductor T2*a* in a direction parallel to the Y direction.

Next, the operation and effects of the electronic component 1 according to the present embodiment will be described. In the present embodiment, at least part of the conductor layer 661 of the first inductor L11 extends in a direction crossing the first arrangement direction (alignment direction of the first columnar conductor T1*a* and the second columnar conductor T1*b*). Particularly in the present embodiment, each of the first portion 661A and the second portion 661B of the conductor layer 661 corresponds to the above "at least part of the conductor layer 661." Therefore, according to the present embodiment, the conductor layer 661 can be longer than that in a case where the conductor layer 661 extends in the first arrangement direction, thereby allowing an inductance of the first inductor L11 to be larger.

Likewise, in the present embodiment, at least part of the conductor layer 662 of the second inductor L21 extends in a direction crossing the second arrangement direction (alignment direction of the third columnar conductor T2*a* and the fourth columnar conductor T2*b*). Particularly in the present embodiment, each of the third portion 662A and the fourth portion 662B of the conductor layer 662 corresponds to the above "at least part of the conductor layer 662." Therefore, according to the present embodiment, the conductor layer 662 can be longer as with the conductor layer 661, thereby allowing an inductance of the second inductor L21 to be larger.

According to the present embodiment, the conductor layer 661 can adjust a coupling between the first inductor L11 and another inductor in the stack 50, and the conductor layer 662 can adjust a coupling between the second inductor L21 and another inductor in the stack 50. Particularly in the present embodiment, the conductor layers 661 and 662 can adjust a coupling between the first inductor L11 and the second inductor L21. This effect will be described below in detail.

In the present embodiment, the first inductor L11 and the second inductor L21 are arranged such that the first opening and the second opening do not overlap each other and the first axis and the second axis do not overlap each other when viewed in a direction parallel to the Y direction. With this, the present embodiment can prevent a too strong coupling between the first inductor L11 and the second inductor L21 from being caused by downsizing of the stack 50.

In the present embodiment, the conductor layers 661 and 662 having their respective shapes approaching each other allow a coupling between the first inductor L11 and the second inductor L21 to be stronger, thereby allowing a too weak coupling between the first inductor L11 and the second inductor L21 to be prevented from being caused by arrangement of the first inductor L11 and the second inductor L21.

Particularly in the present embodiment, each of the second portion 661B of the conductor layer 661 and the fourth portion 662B of the conductor layer 662 substantially includes a straight portion extending in a straight line. Here, assume a virtual straight line crossing both of the straight portion of the second portion 661B and the straight portion of the fourth portion 662B. In the present embodiment, the second portion 661B of the conductor layer 661 and the fourth portion 662B of the conductor layer 662 overlap each other when viewed in one direction parallel to the virtual straight line. The straight portion of the second portion 661B and the straight portion of the fourth portion 662B are parallel to or approximately parallel to each other. With this, the present embodiment allows a coupling between the first inductor L11 and the second inductor L21 to be stronger.

In the present embodiment, the first and second inductors L11 and L21 are arranged at a posture where a distance between the second columnar conductor T1*b* and the fourth columnar conductor T2*b* is smaller. Specifically, a distance between the second columnar conductor T1*b* and the fourth columnar conductor T2*b* in a direction parallel to the Y direction is smaller than a distance between the first columnar conductor T1*a* and the third columnar conductor T2*a* in a direction parallel to the Y direction. With this, the present embodiment allows a coupling between the first inductor L11 and the second inductor L21 to be stronger.

As described above, the present embodiment allows desired characteristics to be achieved, while suppressing occurrence of an issue caused by downsizing of the stack 50 and arrangement of the first and second inductors L11 and L21.

Next, effects of the present embodiment will be described in further detail comparing with an electronic component 101 of a comparative example. First, a configuration of the electronic component 101 of the comparative example will be described in detail. A circuit configuration of the electronic component 101 of the comparative example is the same as the circuit configuration of the electronic component 1 according to the present embodiment shown in FIG. 1. A physical configuration of the electronic component 101 of the comparative example is the same as the physical configuration of the electronic component 1, except points described below.

The electronic component 101 of the comparative example includes a stack 50 as with the electronic component 1. Note, however, that the stack 50 in the electronic component 101 of the comparative example includes dielectric layers 166 and 167 in place of the dielectric layers 66 and 67 in the present embodiment. The dielectric layers 166 and 167 are sixteenth and seventeenth dielectric layers, respectively.

Figure 8A:
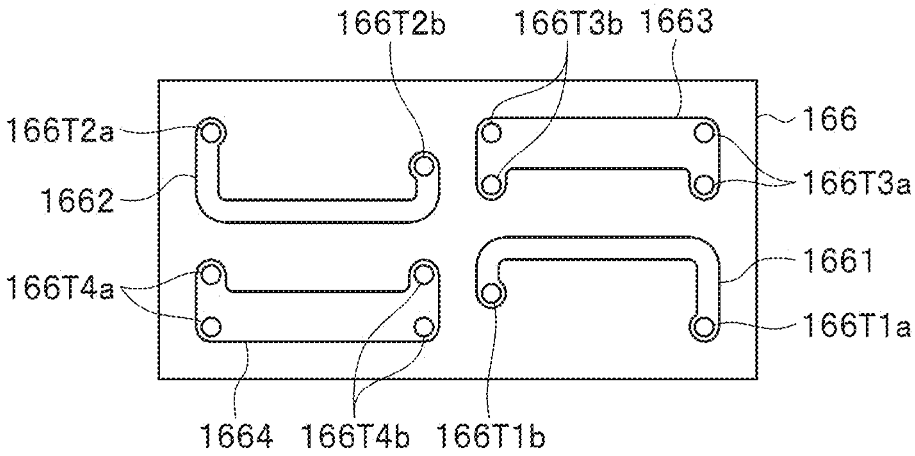
FIG. 8A RELATED ART
FIGS. 8A and 8B are explanatory diagrams showing respective patterned surfaces of sixteenth and seventeenth dielectric layers in a stack in a multilayer electronic component of a comparative example.

FIG. 8A shows a patterned surface of the sixteenth dielectric layer 166. Inductor conductor layers 1661, 1662, 1663, and 1664 are formed on the patterned surface of the dielectric layer 166. The conductor layer 1661 includes a first end and a second end located at both ends of the conductor layer 1661 in the longitudinal direction. The conductor layer 1662 includes a first end and a second end located at both ends of the conductor layer 1662 in the longitudinal direction. The conductor layer 1663 includes a first end and a second end located at both ends of the conductor layer 1663 in the longitudinal direction. The conductor layer 1664 includes a first end and a second end located at both ends of the conductor layer 1664 in the longitudinal direction.

The through hole 55T1*a* formed in the dielectric layer 65 (see FIG. 4B) and the through hole 166T1*a* shown in FIG. 8A are connected to a portion near the first end of the conductor layer 1661. The through hole 55T1*b* formed in the dielectric layer 65 (see FIG. 4B) and the through hole 166T1*b* shown in FIG. 8A are connected to a portion near the second end of the conductor layer 1661. The through hole 55T2*a* formed in the dielectric layer 65 (see FIG. 4B) and the through hole 166T2*a* shown in FIG. 8A are connected to a portion near the first end of the conductor layer 1662. The through hole 55T2*b* formed in the dielectric layer 65 (see FIG. 4B) and the through hole 166T2*b* shown in FIG. 8A are connected to a portion near the second end of the conductor layer 1662.

The two through holes 55T3*a* formed in the dielectric layer 65 (see FIG. 4B) and the two through holes 166T3*a* shown in FIG. 8A are connected to a portion near the first end of the conductor layer 1663. The two through holes 55T3*b* formed in the dielectric layer 65 (see FIG. 4B) and the two through holes 166T3*b* shown in FIG. 8A are connected to a portion near the second end of the conductor layer 1663. The two through holes 55T4*a* formed in the dielectric layer 65 (see FIG. 4B) and the two through holes 166T4*a* shown in FIG. 8A are connected to a portion near the first end of the conductor layer 1664. The two through holes 55T4*b* formed in the dielectric layer 65 (see FIG. 4B) and the two through holes 166T4*b* shown in FIG. 8A are connected to a portion near the second end of the conductor layer 1664.

Figure 8B:
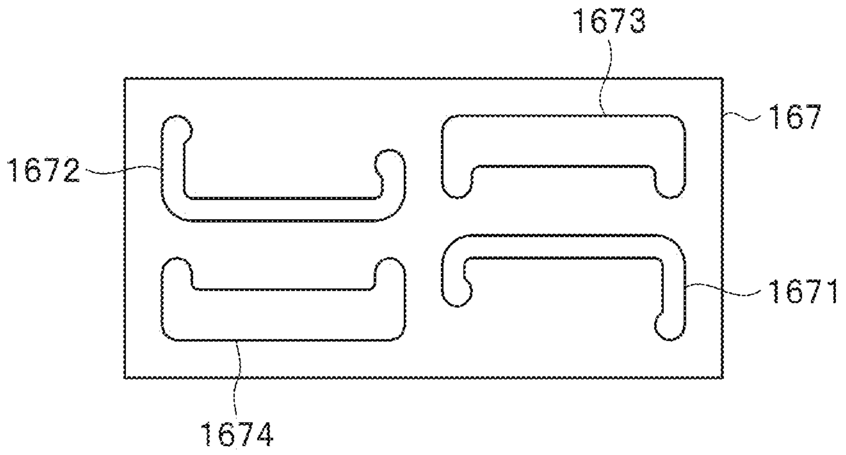
FIG. 8B RELATED ART

FIG. 8B shows a patterned surface of the seventeenth dielectric layer 167. Inductor conductor layers 1671, 1672, 1673, and 1674 are formed on the patterned surface of the dielectric layer 167. The conductor layer 1671 includes a first end and a second end located at both ends of the conductor layer 1671 in the longitudinal direction. The conductor layer 1672 includes a first end and a second end located at both ends of the conductor layer 1672 in the longitudinal direction. The conductor layer 1673 includes a first end and a second end located at both ends of the conductor layer 1673 in the longitudinal direction. The conductor layer 1674 includes a first end and a second end located at both ends of the conductor layer 1674 in the longitudinal direction.

The through hole 166T1*a* is connected to a portion near the first end of the conductor layer 1671. The through hole 166T1*b* is connected to a portion near the second end of the conductor layer 1671. The through hole 166T2*a* is connected to a portion near the first end of the conductor layer 1672. The through hole 166T2*b* is connected to a portion near the second end of the conductor layer 1672.

The two through holes 166T3*a* are connected to a portion near the first end of the conductor layer 1673. The two through holes 166T3*b* are connected to a portion near the second end of the conductor layer 1673. The two through holes 166T4*a* are connected to a portion near the first end of the conductor layer 1674. The two through holes 166T4*b* are connected to a portion near the second end of the conductor layer 1674.

Figure 9:
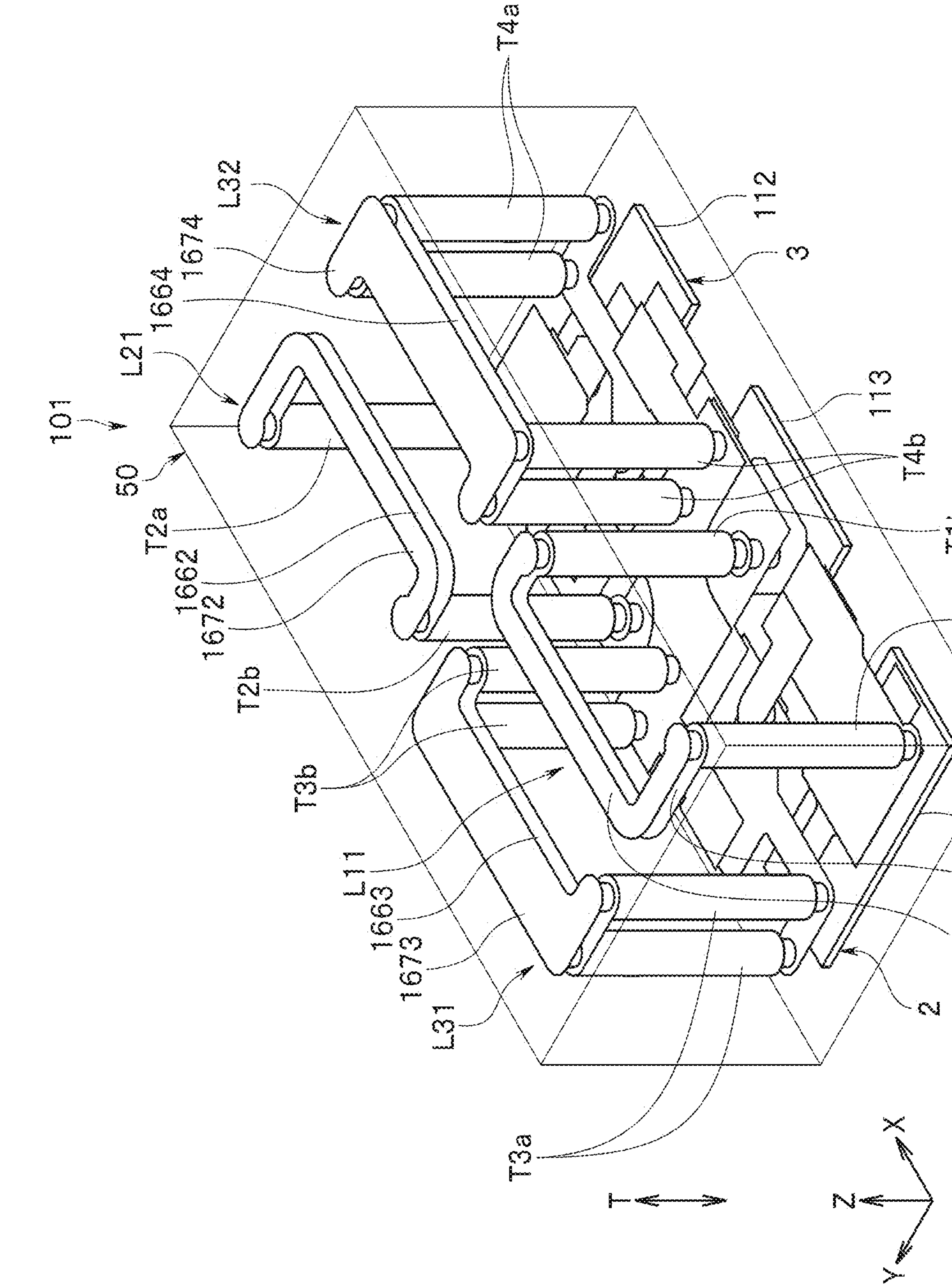
FIG. 9 RELATED ART
FIG. 9 is a perspective view showing an inside of the stack in the multilayer electronic component of the comparative example.

FIG. 9 shows an inside of the stack 50 in the electronic component 101 of the comparative example. Arrangement of the first to fourth inductors L11, L21, L31, and L32 in the electronic component 101 of the comparative example is substantially the same as the arrangement of the first to fourth inductors L11, L21, L31, and L32 in the electronic component 1.

In the electronic component 101 of the comparative example, the first inductor L11 is composed of the inductor conductor layers 1661 and 1671, the first columnar conductor T1*a*, the second columnar conductor T1*b*, and the through holes 166T1*a* and 166T1*b*. As shown in FIG. 8B, the conductor layer 1661 includes a first portion including a first end of the conductor layer 1661 and extending in a direction parallel to the Y direction, a second portion including a second end of the conductor layer 1661 and extending in a direction parallel to the Y direction, and a third portion extending in a direction parallel to the X direction and connecting the first portion and the second portion to each other. The conductor layer 1671 has the same shape as that of the conductor layer 1661.

In the electronic component 101 of the comparative example, the second inductor L21 is composed of the inductor conductor layers 1662 and 1672, the third columnar conductor T2*a*, the fourth columnar conductor T2*b*, and the through holes 166T2*a* and 166T2*b*. As shown in FIG. 8B, the conductor layer 1662 includes a fourth portion including a first end of the conductor layer 1662 and extending in a direction parallel to the Y direction, a fifth portion including a second end of the conductor layer 1662 and extending in a direction parallel to the Y direction, and a sixth portion extending in a direction parallel to the X direction and connecting the fourth portion and the fifth portion to each other. The conductor layer 1672 has the same shape as that of the conductor layer 1662.

In the electronic component 101 of the comparative example, the third inductor L31 is composed of the inductor conductor layers 1663 and 1673, the two columnar conductors T3*a*, the two columnar conductors T3*b*, and the through holes 166T3*a* and 166T3*b*. Shapes of the conductor layers 1663 and 1673 are the same as the shapes of the conductor layers 663 and 673 in the present embodiment, respectively.

In the electronic component 101 of the comparative example, the fourth inductor L32 is composed of the inductor conductor layers 1664 and 1674, the two columnar conductors T4*a*, the two columnar conductors T4*b*, and the through holes 166T4*a* and 166T4*b*. Shapes of the conductor layers 1664 and 1674 are the same as the shapes of the conductor layers 664 and 674 in the present embodiment, respectively.

Next, respective pass attenuation characteristics of a model of the example embodiment and a model of the comparative example computed by a simulation will be described. The model of the example embodiment is a model of the electronic component 1 according to the present embodiment. The model of the comparative example is a model of the electronic component 101 of the comparative example.

Figure 10:
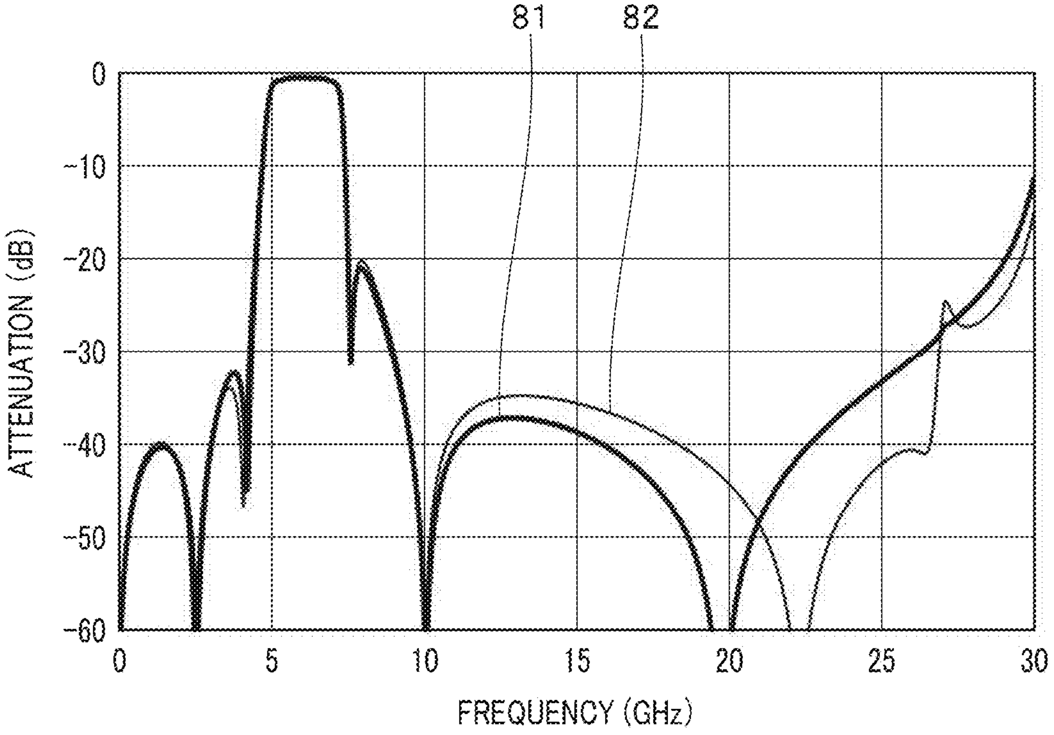
FIG. 10 is a characteristic chart showing respective pass attenuation characteristics of a model of an example embodiment and a model of the comparative example.
Figure 11:
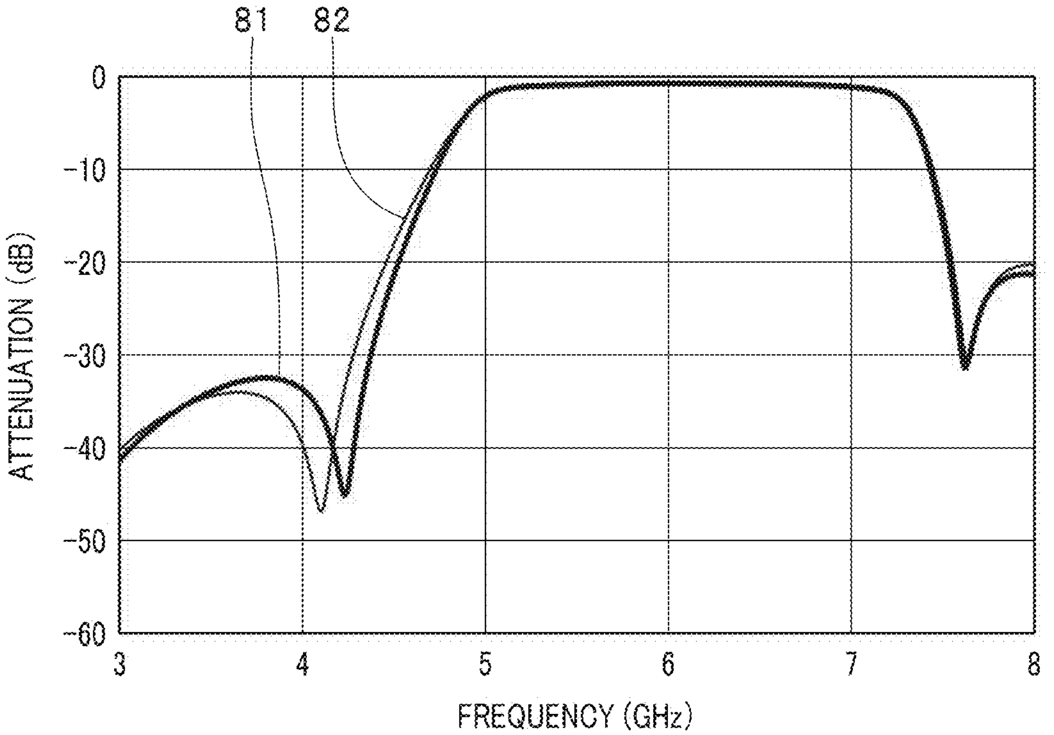
FIG. 11 is a characteristic chart showing an enlarged part of the pass attenuation characteristics shown in FIG. 10.

FIG. 10 is a characteristic chart showing the respective pass attenuation characteristics of the model of the example embodiment and the model of the comparative example. FIG. 11 is a characteristic chart showing an enlarged part of FIG. 10. In FIGS. 10 and 11, the horizontal axis indicates the frequency, and the vertical axis indicates the attenuation. In FIGS. 10 and 11, a curve denoted by a reference numeral 81 indicates a pass attenuation characteristic of the model of the example embodiment, and a curve denoted by a reference numeral 82 indicates a pass attenuation characteristic of the model of the comparative example.

In each of FIGS. 10 and 11, a frequency domain where an absolute value of the attenuation has a value close to zero is a passband of the band-pass filter. In the model of the example embodiment, a gap (frequency difference) between two attenuation poles occurred in a frequency domain lower than the passband is larger than that of the model of the comparative example. With this, the model of the example embodiment achieves a characteristic where an absolute value of the attenuation changes sharply in a frequency domain lower than the passband and close to the passband. This result is caused by a coupling between the first inductor L11 and the second inductor L21 being stronger in the model of the example embodiment compared to that in the model of the comparative example. As can be seen from this result, adjustment of shapes of conductor layers included in the respective first and second inductors L11 and L21 can adjust the characteristics.

Incidentally, as shown in FIG. 1, the first high-pass filter 10 and the second high-pass filter 20 include the first inductor L11 and the second inductor L21, respectively. The low-pass filter 30 is provided between the first high-pass filter 10 and the second high-pass filter 20, in the circuit configuration. As can be seen from the simulation result, the present embodiment can adjust a coupling between the first inductor L11 and the second inductor L21 included in the first high-pass filter 10 and the second high-pass filter 20 not adjacent to each other in the circuit configuration.

Second Embodiment

Figure 12:
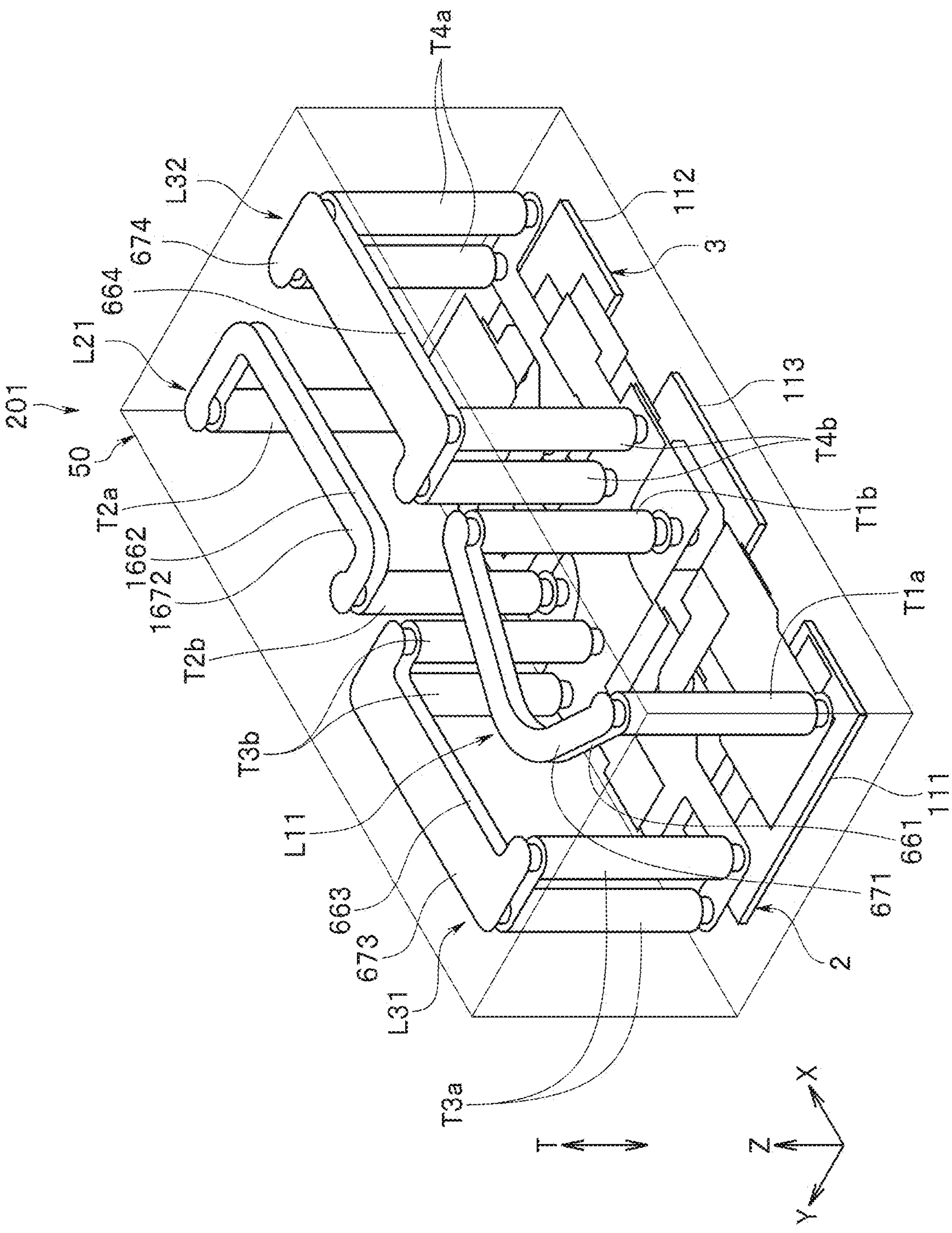
FIG. 12 is a perspective view showing an inside of a stack in a multilayer electronic component according to a second embodiment of the present invention.

Next, a second embodiment of the present invention will be described with reference to FIG. 12. FIG. 12 is a perspective view showing an inside of the stack in the electronic component according to the present embodiment.

A circuit configuration of the electronic component 201 according to the present embodiment is the same as the circuit configuration of the electronic component 1 according to the first embodiment. A physical configuration of the electronic component 201 according to the present embodiment is the same as the physical configuration of the electronic component 1 according to the first embodiment, except points described below.

The electronic component 201 according to the present embodiment includes a stack 50 as with the electronic component 1 according to the first embodiment. Note, however, that the stack 50 in the electronic component 201 according to the present embodiment includes the sixteenth and seventeenth dielectric layers in the present embodiment in place of the dielectric layers 66 and 67 in the first embodiment.

Inductor conductor layers 661, 663, 664, and 1662 are formed on a patterned surface of the sixteenth dielectric layer in the present embodiment. Shapes and arrangement of the conductor layers 661, 663, and 664 are the same as the shapes and arrangement of the conductor layers 661, 663, and 664 formed on the patterned surface of the dielectric layer 66 in the first embodiment. A shape and arrangement of the conductor layer 1662 are the same as the shape and arrangement of the conductor layer 1662 formed on the patterned surface of the dielectric layer 166 in the electronic component 101 of the comparative example described in the first embodiment.

Connection relations between the conductor layers 661, 663, and 664 and the columnar conductors T1*a*, T1*b*, T3*a*, T3*b*, T4*a*, and T4*b* are the same as those of the electronic component 1 according to the first embodiment. A connection relation between the conductor layer 1662 and the columnar conductors T2*a* and T2*b* is the same as that of the electronic component 101 of the comparative example.

Inductor conductor layers 671, 673, 674, and 1672 are formed on a patterned surface of the seventeenth dielectric layer in the present embodiment. Shapes and arrangement of the conductor layers 671, 673, and 674 are the same as the shapes and arrangement of the conductor layers 671, 673, and 674 formed on the patterned surface of the dielectric layer 67 in the first embodiment. A shape and arrangement of the conductor layer 1672 are the same as the shape and arrangement of the conductor layer 1672 formed on the patterned surface of the dielectric layer 167 in the electronic component 101 of the comparative example described in the first embodiment.

A plurality of through holes are formed on the sixteenth dielectric layer in the present embodiment, the plurality of through holes having the same connection relations with the conductor layers 661, 663, 664, 671, 673, and 674 as those of the through holes 66T1*a*, 66T1*b*, 66T3*a*, 66T3*b*, 66T4*a*, and 66T4*b* shown in FIG. 4C. Two through holes are further formed on the sixteenth dielectric layer in the present embodiment, the two through holes having the same connection relations with the conductor layers 1662 and 1672 as those of the through holes 166T2*a* and 166T2*b* shown in FIG. 8A.

Shapes and arrangement of the first, third, and fourth inductors L11, L31, and L32 in the present embodiment are the same as the shapes and arrangement of the first, third, and fourth inductors L11, L31, and L32 in the electronic component 1 according to the first embodiment. A shape and arrangement of the second inductor L21 in the present embodiment are the same as the shape and arrangement of the second inductor L21 in the electronic component 101 of the comparative example.

Other configurations, operation, and effects of the present embodiment are similar to those of the first embodiment, except for operation and an effect related to the second inductor L21.

The present invention is not limited to the foregoing embodiments, and various modifications may be made thereto. For example, the multilayer electronic component of the present invention may be an electronic component other than a band-pass filter, such as a branching filter.

The electronic component 1 may include a first low-pass filter including an inductor corresponding to the third inductor L31 and a second low-pass filter including an inductor corresponding to the fourth inductor L32, in place of the low-pass filter 30. The first low-pass filter and the second low-pass filter may be directly or indirectly connected in series.

As described above, a multilayer electronic component of a first aspect of the present invention includes a stack including a plurality of dielectric layers stacked together, a first inductor including a first conductor layer extending along a plane crossing a stacking direction of the plurality of dielectric layers, a first columnar conductor extending in a direction parallel to the stacking direction and connected to a portion near a first end of the first conductor layer, and a second columnar conductor extending in a direction parallel to the stacking direction and connected to a portion near a second end of the first conductor layer being different from the first end, and a second inductor including a second conductor layer extending along a plane crossing the stacking direction, a third columnar conductor extending in a direction parallel to the stacking direction and connected to a portion near a first end of the second conductor layer, and a fourth columnar conductor extending in a direction parallel to the stacking direction and connected to a portion near a second end of the second conductor layer being different from the first end.

The stack includes a first surface and a second surface located at both ends of the stack in the stacking direction, and a first side surface, a second side surface, a third side surface, and a fourth side surface connecting the first surface and the second surface to each other. The first side surface and the second side surface are opposite to each other. The third side surface and the fourth side surface are opposite to each other. The first inductor is arranged at a position closer to the first side surface than the second side surface. The second inductor is arranged at a position closer to the second side surface than the first side surface. At least part of the first conductor layer extends in a direction crossing an alignment direction of the first columnar conductor and the second columnar conductor at an angle other than an odd number multiple of 90 degrees. At least part of the second conductor layer extends in a direction crossing an alignment direction of the third columnar conductor and the fourth columnar conductor at an angle other than an odd number multiple of 90 degrees.

In the multilayer electronic component of the first aspect of the present invention, the first inductor may be arranged at a position closer to the third side surface than the fourth side surface. The second inductor may be arranged at a position closer to the fourth side surface than the third side surface.

In the multilayer electronic component of the first aspect of the present invention, the first conductor layer may include a first portion extending to approach the second side surface while going away from the first end of the first conductor layer, and a second portion extending to approach the second side surface while going away from the second end of the first conductor layer. The second conductor layer may include a third portion extending to approach the first side surface while going away from the first end of the second conductor layer, and a fourth portion extending to approach the first side surface while going away from the second end of the second conductor layer.

In the multilayer electronic component of the first aspect of the present invention, each of the first conductor layer and the second conductor layer may include a straight portion extending in a straight line. The straight portion of the first conductor layer and the straight portion of the second conductor layer may be parallel to each other.

In the multilayer electronic component of the first aspect of the present invention, the first conductor layer may include a first portion extending in one direction, and a second portion extending in a direction different from the one direction of the first portion and having a length different from a length of the first portion. The second conductor layer may include a third portion extending in one direction, and a fourth portion extending in a direction different from the one direction of the third portion and having a length different from a length of the third portion. A distance from the second portion to the fourth portion may be shorter than a distance from the first portion to the third portion.

In the multilayer electronic component of the first aspect of the present invention, each of the first conductor layer and the second conductor layer may include a curved portion extending in a curve.

In the multilayer electronic component of the first aspect of the present invention, when a direction which is orthogonal to the stacking direction and in which the first side surface and the second side surface are aligned is referred to as a first direction, and a direction which is orthogonal to the stacking direction and in which the third side surface and the fourth side surface are aligned is referred to as a second direction, the second columnar conductor and the fourth columnar conductor may be arranged between the first columnar conductor and the third columnar conductor in the second direction. A distance between the second columnar conductor and the fourth columnar conductor in the first direction may be smaller than a distance between the first columnar conductor and the third columnar conductor in the first direction.

The multilayer electronic component of the first aspect of the present invention may further include a first high-pass filter, a second high-pass filter, and a low-pass filter provided between the first high-pass filter and the second high-pass filter in a circuit configuration. The first high-pass filter may include the first inductor. The second high-pass filter may include the second inductor. The low-pass filter may include a third inductor and a fourth inductor each including a conductor layer extending along the plane and a pair of columnar conductors extending in a direction parallel to the stacking direction and connected to the conductor layer. The third inductor and the fourth inductor may be aligned in a direction crossing an alignment direction of the first inductor and the second inductor.

A multilayer electronic component of a second aspect of the present invention includes a stack including a plurality of dielectric layers stacked together, and an inductor including a conductor layer extending along a plane crossing a stacking direction of the plurality of dielectric layers, a first columnar conductor extending in a direction parallel to the stacking direction and connected to a portion near a first end of the conductor layer, and a second columnar conductor extending in a direction parallel to the stacking direction and connected to a portion near a second end of the conductor layer being different from the first end. The conductor layer includes a first portion and a second portion extending in a direction crossing an alignment direction of the first columnar conductor and the second columnar conductor, extending in different directions, and having different lengths.

In the multilayer electronic component of the second aspect of the present invention, the conductor layer may further include a curved portion extending in a curve and arranged between the first portion and the second portion in a longitudinal direction of the conductor layer.

In the multilayer electronic component of the second aspect of the present invention, the stack may include a first surface and a second surface located at both ends of the stack in the stacking direction, and a first side surface, a second side surface, a third side surface, and a fourth side surface connecting the first surface and the second surface to each other. The first side surface and the second side surface may face opposite directions. The third side surface and the fourth side surface may face opposite directions. The inductor may be arranged at a position closer to the first side surface than the second side surface. The first portion may include the first end of the conductor layer and may extend to approach the second side surface while going away from the first end. The second portion may include the second end of the conductor layer and may extend to approach the second side surface while going away from the second end.

In the multilayer electronic component of the second aspect of the present invention, a distance between the second columnar conductor and the first side surface may be larger than a distance between the first columnar conductor and the first side surface.

Obviously, many modifications and variations of the present invention are possible in the light of the above teachings. Thus, it is to be understood that, within the scope of the appended claims and equivalents thereof, the invention may be practiced in other embodiments than the foregoing most preferable embodiment.

What is claimed is:

1. A multilayer electronic component comprising:

a stack including a plurality of dielectric layers stacked together;

a first inductor including a first conductor layer extending along a plane crossing a stacking direction of the plurality of dielectric layers, a first columnar conductor extending in a direction parallel to the stacking direction and connected to a portion near a first end of the first conductor layer, and a second columnar conductor extending in a direction parallel to the stacking direction and connected to a portion near a second end of the first conductor layer being different from the first end;

a second inductor including a second conductor layer extending along a plane crossing the stacking direction, a third columnar conductor extending in a direction parallel to the stacking direction and connected to a portion near a first end of the second conductor layer, and a fourth columnar conductor extending in a direction parallel to the stacking direction and connected to a portion near a second end of the second conductor layer being different from the first end;

a first high-pass filter;

a second high-pass filter; and a low-pass filter provided between the first high-pass filter and the second high-pass filter in a circuit configuration, wherein the stack includes a first surface and a second surface located at both ends of the stack in the stacking direction, and a first side surface, a second side surface, a third side surface, and a fourth side surface connecting the first surface and the second surface to each other, the first side surface and the second side surface are opposite to each other, the third side surface and the fourth side surface are opposite to each other, the first inductor is arranged at a position closer to the first side surface than the second side surface, the second inductor is arranged at a position closer to the second side surface than the first side surface, at least part of the first conductor layer extends in a direction crossing an alignment direction of the first columnar conductor and the second columnar conductor at an angle other than an odd number multiple of 90 degrees, at least part of the second conductor layer extends in a direction crossing an alignment direction of the third columnar conductor and the fourth columnar conductor at an angle other than an odd number multiple of 90 degrees, the first high-pass filter includes the first inductor, and the second high-pass filter includes the second inductor.

2. The multilayer electronic component according to claim 1, wherein the first conductor layer includes a first portion extending in one direction, and a second portion extending in a direction different from the one direction of the first portion and having a length different from a length of the first portion, and the second conductor layer includes a third portion extending in one direction, and a fourth portion extending in a direction different from the one direction of the third portion and having a length different from a length of the third portion.

3. The multilayer electronic component according to claim 2, wherein a distance from the second portion to the fourth portion is shorter than a distance from the first portion to the third portion.

4. The multilayer electronic component according to claim 1, wherein the first inductor is arranged at a position closer to the third side surface than the fourth side surface, and the second inductor is arranged at a position closer to the fourth side surface than the third side surface.

5. The multilayer electronic component according to claim 1, wherein the first conductor layer includes a first portion extending to approach the second side surface while going away from the first end of the first conductor layer, and a second portion extending to approach the second side surface while going away from the second end of the first conductor layer, and the second conductor layer includes a third portion extending to approach the first side surface while going away from the first end of the second conductor layer, and a fourth portion extending to approach the first side surface while going away from the second end of the second conductor layer.

6. The multilayer electronic component according to claim 1, wherein each of the first conductor layer and the second conductor layer includes a straight portion extending in a straight line, and the straight portion of the first conductor layer and the straight portion of the second conductor layer are parallel to each other.

7. The multilayer electronic component according to claim 1, wherein each of the first conductor layer and the second conductor layer includes a curved portion extending in a curve.

8. The multilayer electronic component according to claim 1, wherein when a direction which is orthogonal to the stacking direction and in which the first side surface and the second side surface are aligned is referred to as a first direction, and a direction which is orthogonal to the stacking direction and in which the third side surface and the fourth side surface are aligned is referred to as a second direction, the second columnar conductor and the fourth columnar conductor are arranged between the first columnar conductor and the third columnar conductor in the second direction, and a distance between the second columnar conductor and the fourth columnar conductor in the first direction is smaller than a distance between the first columnar conductor and the third columnar conductor in the first direction.

9. The multilayer electronic component according to claim 1, wherein the low-pass filter includes a third inductor and a fourth inductor each including a conductor layer extending along the plane and a pair of columnar conductors extending in a direction parallel to the stacking direction and connected to the conductor layer, and the third inductor and the fourth inductor are aligned in a direction crossing an alignment direction of the first inductor and the second inductor.

* * * * *